United States Patent

Vilf et al.

[15] 3,660,733

[45] May 2, 1972

[54] HOMOGENEOUS SEMICONDUCTOR WITH INTERRELATED ANTIBARRIER CONTACTS

[72] Inventors: Fernando Zhozevich Vilf, Istrinskaya ulitsa 5 korpus 2, kv. 9; Alexandr Pavlovich Lysenko, Khoroshevskoe shosse 5 korpus 6, kv. 10, both of Moscow, U.S.S.R.

[22] Filed: Oct. 29, 1969

[21] Appl. No.: 872,291

[52] U.S. Cl. ....................317/234, 317/235

[51] Int. Cl. ....................H01l 5/02

[58] Field of Search ....................317/237, 234, 235

[56] References Cited

UNITED STATES PATENTS

| | | | |
|---|---|---|---|
| 3,377,566 | 4/1968 | Lanza | 317/234 X |
| 3,484,662 | 12/1969 | Hagon | 317/235 |
| 3,435,306 | 3/1969 | Martin | 317/237 |
| 3,443,169 | 5/1969 | Foxell et al. | 317/234 |
| 3,465,265 | 9/1969 | Kuru | 317/234 X |

FOREIGN PATENTS OR APPLICATIONS

| | | | |
|---|---|---|---|
| 849,476 | 9/1960 | Great Britain | 317/234 |

*Primary Examiner*—James D. Kallan
*Attorney*—Holman & Stern

[57] ABSTRACT

A semiconductor device comprising a homogeneous semiconductor crystal and two antibarrier contacts, the area of one of which is smaller than that of the other and the diameter is smaller than the distance between the contacts and is limited in absolute value lying within 1 to 100 microns. This device can perform various functions, such as an oscillator, or a currector or a switch.

6 Claims, 11 Drawing Figures

INVENTORS
F. Z. VILF
A. P. LYSENKO

By Holman, Glascock, Downing & Seebold

ATTORNEYS

INVENTORS
F. Z. VILF
A. P. LYSENKO
By Holman, Glascock, Downing & Seebold
ATTORNEYS

HOMOGENEOUS SEMICONDUCTOR WITH INTERRELATED ANTIBARRIER CONTACTS

The invention relates to electronics and, in particular, to semiconductor devices intended to regulate and switch electric currents or to generate electromagnetic waves.

Well known in the art are semiconductor devices, such as Gunn-effect oscillators designed around a homogeneous semiconductor crystal having two antibarrier contacts.

One of the disadvantages of such devices consists in their limited applicability: they can be used only for microwave generation and they can be gradually tuned by varying their supply voltage within a highly limited frequency band. These semiconductor devices can not be used as oscillators with a linear dependence of oscillation frequency on current, or as currectors, or as switches.

To perform the two latter functions special semiconductor devices with p-n junctions are widely used: field-effect transistors for current regulation and thyristors for current switching.

However, both the field-effect transistors and the thyristors are extremely difficult to manufacture. Besides, their reactance is much higher than that of devices using homogeneous crystals which is undesirable in cases when these devices are used in pulse circuits.

An object of the invention is to provide a semiconductor device which could be used as an oscillator, or a currector or as a switch.

It is yet another object of the invention to provide a semiconductor device which may be fabricated using a wide range of semiconductors, including germanium and silicon of the N- and P-type conductivity.

Another object of the invention is to provide a semiconductor device which, while performing the above functions, would not have P-N junctions.

In accordance with the above-mentioned and other objects the present invention consists in that a semiconductor device comprises a homogeneous semiconductor crystal having two antibarrier contacts and is characterized by three integrally interconnected features — first, the area of one contact is larger than that of the other; second, the diameter of one of the contacts is smaller than the distance between the contacts, and third, the diameter of one of the contacts is limited in absolute value, lying within 1 to 100 microns and depending on the parameters of concrete semiconductor (concentration of free charge carriers, their mobility and type of conductivity) used as the basic material of the device.

It is advisable to select the area of the smaller antibarrier contact to be equal to $10^{-5}$ cm$^2$ and the area of the bigger contact, a hundred times as large, while the distance between the contacts should be in the order of 300 microns.

Depending upon the purpose of the device, the two antibarrier contacts can be attached either to the opposite facets of the crystal or both to one of them.

In order to increase the reliability and heat resistance of the device, the antibarrier contacts can be arranged coaxially with respect to the semiconductor crystal made as a film which has been grown on a dielectric substrate.

It is advisable that the epitaxial semiconductor film having the same type of conductance as the crystal but a higher value of resistivity should be applied to one of the facets of the crystal. In this case the ohmic contacts can be fixed in two ways: either both on the surface of the epitaxial film or the smaller one, on the surface of the epitaxial film while the bigger one, on the opposite facet of the crystal.

The device of the present invention is a multipurpose i.e. it can be used either as a currector, or as an oscillator or as a switch. As compared to the known devices, it is simpler in production and more reliable in operation.

Other objects and advantages of the present invention will be more clear from the description its embodiments given by way of example with reference to the accompanying drawings, in which.

Figure 7:
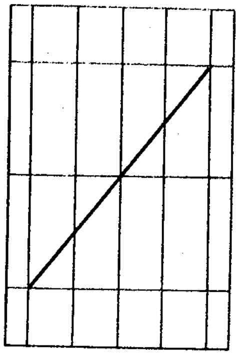
Figure 8:
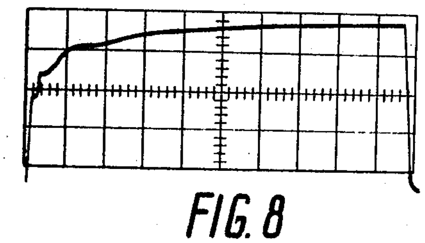
Figure 9:
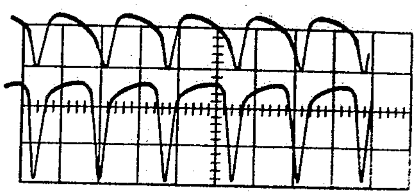
Figures 10, 11:
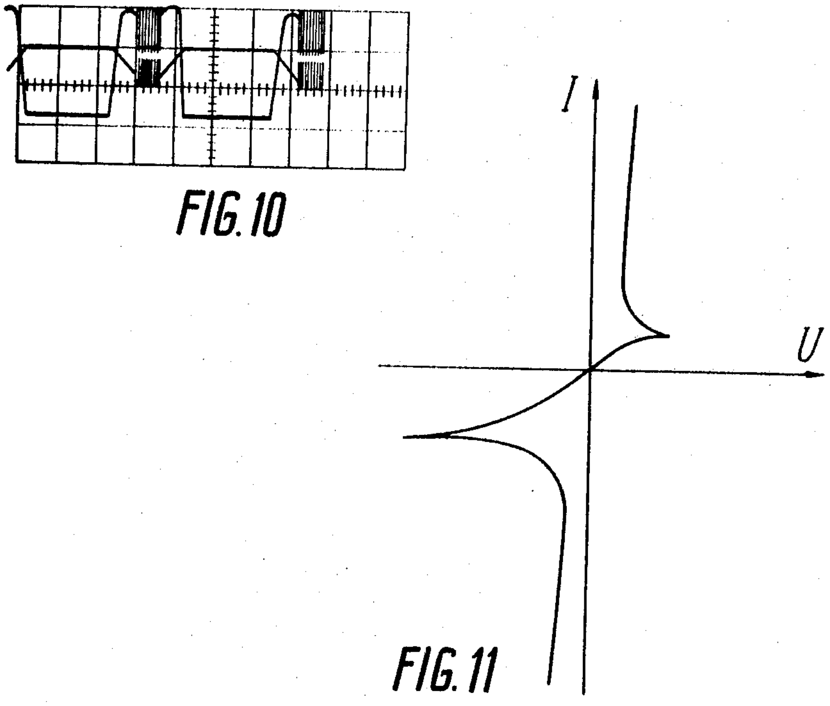

FIG. 7 presents the frequency of self-excited oscillations vs. the bias current;

FIG. 8 is the oscillogram of a pulse voltage generated by the device;

FIG. 9 is the oscillogram of continuous current waves generated by the device;

FIG. 10 presents the oscillograms of currents and voltages produced by the device operating in the pulse mode, and FIG. 11 is the current-voltage characteristic of the device operating as a switch.

Figure 1:
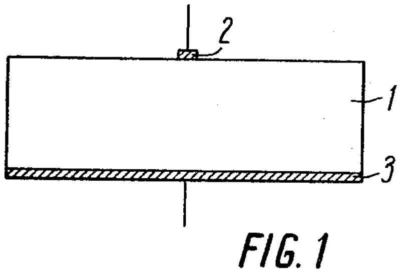
FIG. 1 shows a semiconductor device with antibarrier contacts applied to the opposite facets of a crystal, according to the invention.

The design of the device in its simplest form is presented in FIG. 1. The device comprises a semiconductor crystal 1,250 microns thick with one of the facets carrying the smaller antibarrier contact 2 made as a disc 35 microns in diameter, and with the opposite facet carrying the bigger contact 3 whose diameter is 800 microns. The crystal, together with its contacts, is housed in a heat-sink package not shown in FIG. 1.

The crystal 1 may be made of semiconductors with both N- and P-type conductivity having an arbitrary shape of valence band and conduction band (for example, germanium, silicon, gallium arsenide, and others).

Figure 2:
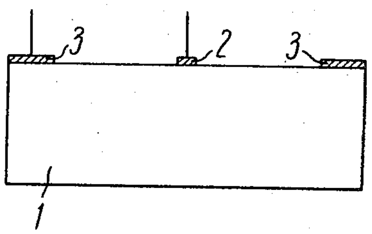
FIG. 2 shows a semiconductor device with contacts applied to one facet of a crystal, according to the invention.

FIG. 2 presents another form of the device with the antibarrier contacts 2 and 3 applied to one facet of the semiconductor crystal 1. This contact arrangement appears to be guite advantageous in case of planar technology.

Figure 3:
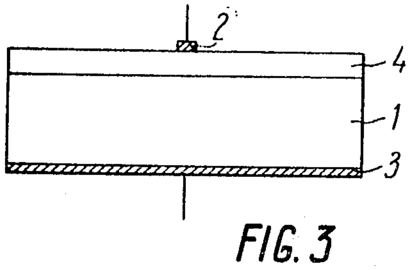
FIG. 3 shows a semiconductor device with an epitaxial film, according to the invention.

In order to reduce threshold values, such as the regulation onset voltage, the oscillation amplitude, etc., the form of the device, as shown in FIG. 3, is used.

In this case the semiconductor crystal 1 serves as a substrate carrying an epitaxial film 4 which is made of the same material and has the same type of conductance as the crystal, but a higher value of conductivity. The antibarrier contacts 2 and 3 can be applied in two ways: either both onto the surface of the epitaxial film 4 or so that the smaller contact 2 is on the surface of the epitaxial film 4 while the bigger one 3 is on the surface of the crystal 1.

Figure 4:
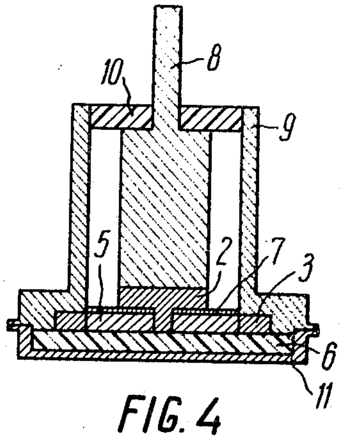
FIG. 4 shows a semiconductor device with antibarrier contacts arranged coaxially, according to the invention.

FIG. 4 shows a form of the device with heat characteristics making it possible to increase dissipated power. The function of a semiconductor crystal in this case is performed by a semiconductor film 5 grown on a heat-conducting dielectric material 6 (e.g. sapphire). The antibarrier contacts 2 and 3 are cylindrical in shape, the smaller contact 2 having been applied to the semiconductor fil through as oxide film 7, while the bigger contact 3, along the contour of the semiconductor film 5. The device is fed with current via heat-sinking electrodes 8 and 9 separated by a ceramic insulator 10. The device is made air-tight with the use of a lid 11.

The operation of the device can be described as follows.

In order to employ the device as a currector the smaller contact 2 should be connected to the positive lead of the power supply for a P-type semiconductor or to the negative lead for an N-type material. This direction of the voltage gradient will hereinafter referred to as "the reverse bias". The voltage gradient direction opposite to one specified above will be called "the forward bias."

Figure 5:
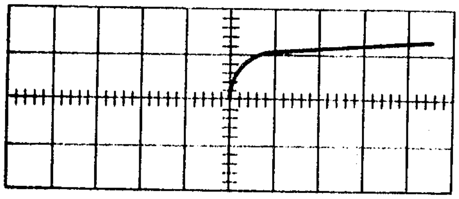
FIG. 5 shows the current-voltage characteristic of the device operating as a currector.

The current-voltage characteristic of the present silicon device operating at DC at temperature of +20° C. is presented in FIG. 5. The area of the smaller antibarrier contact is chosen to be $10^{-5}$ cm$^2$, while that of the bigger one 3 is 100 times as large.

Germanium devices have similar characteristics.

In order to employ the device as a self-excited oscillator whose oscillation frequency can be gradually varied by changing the bias current, the device should be made to conduct a current exceeding a certain threshold level which is determined by the dimensions of the contacts and by the properties of the semiconductor material. The oscillation mode can be obtained both at the forward and at the reverse bias.

Figure 6:
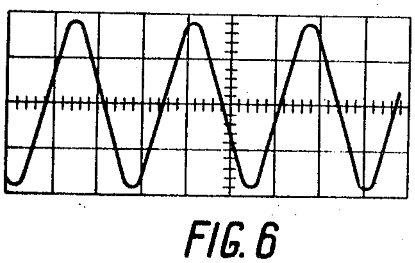
FIG. 6 is the oscillogram of a continuous wave voltage generated by the device.

FIG. 6 presents an oscillogram of such oscillations. The present silicon device will produce such continuous waves at +20° C. The frequency of these oscillations is, as a rule, within the range from $10^5$ to $10^7$ Hz. In case of a forward bias the amplitude of the oscillations and the threshold current are lower, while the frequency of oscillations is higher than in case of a reverse bias. In the given mode of operation the frequency of oscillations is linearly dependent, within a broad range, on the bias current as shown (for a standard silicon device) in FIG. 7.

As is evident from the oscillogram (FIG. 8) of voltage waves generated by the device in the pulse mode of operation the depth of modulation in this case approaches 100 percent.

In order to employ the device as oscillator whose frequency does not depend on the current flowing through the device it should be fed with a voltage causing the reverse bias and raise the voltage until it exceeds a certain threshold level.

FIG. 9 presents the oscillogram of self-excited current oscillations observed in the circuit of the device. A germanium device will generate such oscillations continuously at the frequencies of the order of 50–100 KHz at +20° C. The depth of modulation in this case as it follows from the oscillogram (FIG. 10) of current and voltage oscillations can reach some tens percent.

Since the current-voltage characteristics of the device manifests S-shaped branches which correspond to the forward and reverse biases, it can be used as a switch.

As compared to the known devices, the present device has a number of technological advantages which make it possible to exclude from the production procedure such complicated steps as creating P-N junctions and controlling their quality.

The device has also a number of other advantages attributed to its performance characteristics.

They are:

1. ability to perform many functions of individual devices, such as a currector, an oscillator or a switch;
2. low inertia in current stabilization mode which is obtained due to the fact that for its operation the device uses the majority carriers;
3. wide temperature range within which the device can operate ( ±200° C), the upper limit being determined only by the onset of the own conductivity of the semiconductor material.
4. wide variety of semiconductor materials which can be used in the device.

While the present invention has been described above in connection with its preferred embodiment, those skilled in the art will easily understand that various modifications and changes can be made without departing from its spirit and scope.

These modifications and changes are considered to be within the spirit and scope of the invention as set forth in appended claims.

What is claimed is:

1. A semiconductor device comprising a homogeneous semiconductor crystal, two antibarrier contacts, the area of one of which is smaller than that of the other and the diameter is smaller than the distance between the contacts, the diameter of the contact of the smaller area being limited in absolute value lying within 1 to 100 microns.

2. A semiconductor device as claimed in claim 1, wherein said antibarrier contacts are provided on the opposite facets of said crystal.

3. A semiconductor device as claimed in claim 1, wherein said antibarrier contacts are both provided on the same facet of said crystal.

4. A semiconductor device as claimed in claim 1, wherein said antibarrier contacts are located coaxially with respect to said semiconductor crystal which is a film grown on a dielectric.

5. A semiconductor device as claimed in claim 1, wherein one of the facets of said crystal is provided with an epitaxial semiconductor film having a larger resistivity than said crystal and the same type of conductivity, said antibarrier contacts being provided on the surface of said epitaxial film.

6. A semiconductor device as claimed in claim 1, wherein one of the facets of said crystal is provided with an epitaxial semiconductor film having a larger resistivity than said crystal and the same type of conductivity, the smaller one of said antibarrier contacts being provided on the surface of said epitaxial film while the bigger contact is provided on the opposite facet of said crystal.

* * * * *